United States Patent [19]

Turnbull

[11] Patent Number: 4,926,051
[45] Date of Patent: May 15, 1990

[54] THERMAL-IMAGE SENSING DEVICES AND THEIR MANUFACTURE

[75] Inventor: Andrew A. Turnbull, Reigate, England

[73] Assignee: U.S. Philips Corp., New York, N.Y.

[21] Appl. No.: 396,744

[22] Filed: Aug. 18, 1989

Related U.S. Application Data

[63] Continuation of Ser. No. 166,141, Mar. 10, 1988, abandoned.

[30] Foreign Application Priority Data

Mar. 13, 1987 [GB] United Kingdom ............... 8705963

[51] Int. Cl.⁵ .................................. H01L 21/84
[52] U.S. Cl. .................... 250/332; 29/832; 250/338.2; 250/338.3; 250/338.4; 437/3
[58] Field of Search ............. 29/832, 840, 852, 853; 250/332, 338.2, 338.3, 338.4; 437/3

[56] References Cited

U.S. PATENT DOCUMENTS

| | | | |
|---|---|---|---|
| 4,072,863 | 2/1978 | Roundy | 250/332 |
| 4,317,063 | 2/1982 | Pedder et al. | 313/388 |
| 4,642,160 | 2/1987 | Burgess | 156/630 |
| 4,663,529 | 5/1987 | Jenner et al. | 250/338.2 |
| 4,704,534 | 11/1987 | Turnbull | 250/338.3 |
| 4,740,700 | 4/1988 | Shaham et al. | 250/332 |

FOREIGN PATENT DOCUMENTS

| | | |
|---|---|---|
| 0055819 | 7/1982 | European Pat. Off. . |
| 0200241 | 7/1982 | European Pat. Off. . |
| 01173368 | 3/1986 | European Pat. Off. . |
| 56-77730 | 6/1981 | Japan ............... 250/338.3 |
| 1508299 | 4/1978 | United Kingdom . |
| 2030023 | 3/1980 | United Kingdom . |
| WO81/10645 | 3/1981 | World Int. Prop. O. . |

Primary Examiner—Constantine Hannaher
Attorney, Agent, or Firm—William L. Botjer

[57] ABSTRACT

A thermal-image sensing device is manufactured with a 2-dimensional array of ferroelectric or pyroelectric infrared detector elements (38) mounted on a circuit substrate (1). The upper surface of the circuit substrate (1) is covered with a thick insulating layer (10) of plastics material in which a corresponding 2-dimensional array of bores (11) is formed. Each of the detector elements (38) is connected to a respective electrode (2) of the circuit substrate (1) by means of a metal coating over the wall of its respective bore (11) and over the respective electrode (2) of the circuit substrate (1). The invention permits a simplification in manufacture while forming a device structure with a high degree of ruggedness and good electrical and thermal insulation between the detector elements (38) and the circuit substrate (1). It also permits the detector element array to be formed in situ on the circuit substrate (1), for example by sawing grooves (36) through a metallised sheet (30,31,32) of the ferroelectric or pyroelectric material mounted on the metal-coated plastics material (10) and then providing top electrode connections (41) bridging the grooves (36).

13 Claims, 2 Drawing Sheets

THERMAL-IMAGE SENSING DEVICES AND THEIR MANUFACTURE

This is a continuation of application Ser. No. 166,141, filed March 10, 1988.

BACKGROUND OF THE INVENTION

This invention relates to thermal-image sensing devices comprising a 2-dimensional array of ferroelectric or pyroelectric infrared detector elements, and further relates to methods of manufacturing such devices.

Published European patent application EP-A-0 173 368 discloses a method of manufacturing a thermal-image sensing device comprising a 2-dimensional array of ferroelectric or pyroelectric infrared detector elements which are mounted on a circuit substrate via an intermediate layer of thermally and electrically insulating material. In this method a corresponding 2-dimensional array of bores is formed in the insulating layer, and each of the detector elements is electrically connected to a respective electrode of the circuit substrate by means of a metal coating over the wall of its respective bore. This electrical connection restricted in cross-section to the thin metal coating provides a low thermal conductive path between the detector elements and the circuit substrate. The whole contents of EP-A-0 173 368 are hereby incorporated as reference material in the present specification.

In the particular method described in EP-A-0 173 368, after forming the detector element array, the insulating layer in the form of a sheet is bonded to a signal electrode layer on one major surface of the detector element array, the bores are etched through the insulating sheet to the signal electrode layer and metallized, and a pattern of grooves (channels) are then etched through the insulating sheet to the detector element array so as to form pillars each surrounding a respective bore. The bores and grooves need to be aligned with respect to the detector element array. This sub-assembly of the metallized insulating pillar structure and detector element array is then carefully mounted on the circuit substrate by means of solder bumps on the corresponding electrodes of the circuit substrate.

This particular method provides a device structure in which the intermediate insulating layer is spaced away from the upper surface of the substrate by the solder bumps and is divided into separate pillars throughout its thickness. This permits the use of insulating layer materials such as cadmium telluride, tellurium, selenium or sulphur, having only moderate insulation properties. An advantage of using these materials is that the bores can be formed by milling with an ion beam at windows in a photoresist coating.

SUMMARY OF THE INVENTION DRAWING

According to one aspect of the present invention a method of manufacturing a thermal-image sensing device comprising such a 2-dimensional array is characterised by the steps of (a) covering at least part of an upper surface of the circuit substrate with plastics material to form said insulating layer with a substantially planar upper surface, (b) locally removing the plastics material from over said electrodes of the circuit substrate so as to form said bores in the insulating layer, (c) depositing metal to form the metal coating in the bores and also on the upper surface of the plastics material at least around the bores, the metal coating being sufficiently thin as not to fill the bores, and (d) mounting the array of detector elements on the metal-coated upper surface of the plastics material.

As will be described more specifically hereinafter, the present invention permits a simplification in the manufacture of a 2-dimensional array of infrared detector elements while forming a device structure with a high degree of ruggedness and good electrical and thermal insulation between the detector elements and the circuit substrate, and also permits the detector element array to be formed in situ on the circuit substrate, for example by sawing grooves through a sheet of the ferroelectric or pyroelectric material mounted on the metal-coated plastics material and then providing top electrode connections bridging the grooves.

According to another aspect of the present invention there is provided a thermal-image sensing device comprising a 2-dimensional array of ferroelectric or pyroelectric infrared detector elements which are separated from each other by grooves and which are mounted on a circuit substrate via an intermediate layer of thermally and electrically insulating material having a corresponding 2-dimensional array of bores, each of the detector elements being connected to a respective electrode of the circuit substrate by means of a metal coating over the wall of its respective bore, characterised in that the insulating layer is of plastics material forming a coating on at least part of the upper surface of the circuit substrate, that the metal coating in the bores extends over the respective electrodes of the circuit substrate, and that a plastics film carrying at least one metal conductor on its lower surface is mounted on top of the array of detector elements to provide top electrode connections which bridge the grooves between the detector elements.

BRIEF DESCRIPTION OF THE DRAWING

These and other features in accordance with the present invention are illustrated specifically in the embodiments of the invention now to be described, by way of example, with reference to the accompanying diagrammatic drawings. In these drawings.

Figure 1:
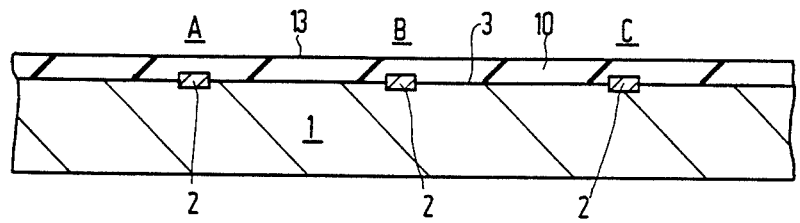
FIGS. 1, 2, 3, 5 and 6 are cross-sectional views of parts of the device structure provided on a circuit substrate as seen at different stages in the manufacture of a thermal-image sensing device by a method in accordance with the invention.

It should be noted that the accompanying drawings are diagrammatic and not drawn to scale. The relative dimensions and proportions of parts of these Figures have been shown exaggerated or diminished for the sake of clarity and convenience in the drawings. The same reference signs as used in one embodiment are generally used when referring to corresponding or similar parts in the other embodiments.

DETAILED DESCRIPTION OF THE PREFERRED EMBODIMENT

A device manufactured in accordance with the present invention may be used in known thermal imager systems, for example in systems such as those disclosed in United Kingdom patent application GB-A-2 030 023 and U.S. Pat. No. US-A-4,072,863 the whole contents of which are hereby incorporated as reference material into the present specification.

Figure 4:
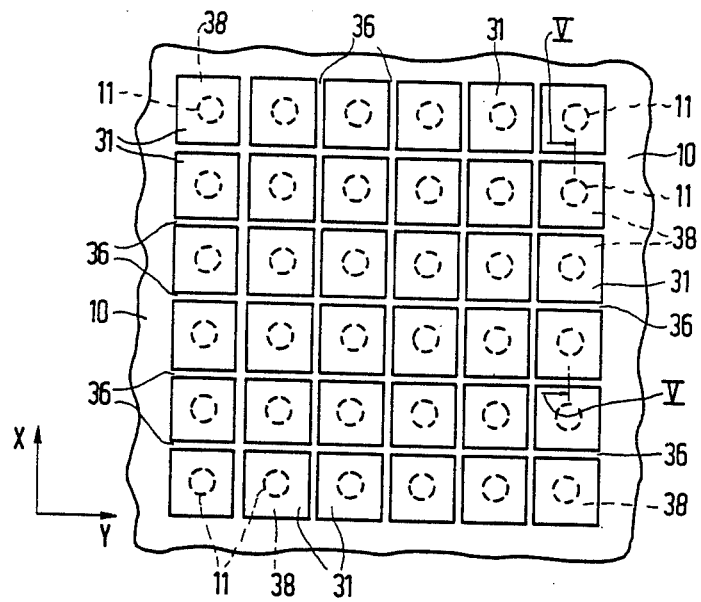
FIG. 4 is a top view of the device structure at an intermediate stage between FIGS. 3 and 5.

The device comprises a circuit substrate 1 which may be of known form, for example a silicon integrated circuit comprising electronic circuitry for reading out and processing the signals from infrared detector elements in a 2-dimensional array. Particular examples of known circuits are given in GB-A-2 030 023. Thus, the internal construction of the circuit substrate 1 is not illustrated in FIG. 1. However the circuit has an array of input electrodes 2 at an upper surface 3 of the substrate 1 for interfacing with the detector elements. Each of the electrodes 2 is to be connected to the signal electrode of a respective infrared detector element. For convenience in the drawing, FIG. 1 shows only three sites A, B and C where detector elements are to be interfaced with the circuitry in the substrate 1, it being understood that there are present in the device a much larger number of sites corresponding to the desired array, for example a square array of 32×32 elements or 128×128 elements. Similarly for convenience in the drawing, FIG. 4 shows only a small number (6×6) in the array. The substrate electrodes 2 may be, for example, aluminium contact pads formed in known manner at windows in an insulating layer at the upper surface 3 of the substrate 1.

In the stage of manufacture illustrated in FIG. 1, the upper surface 3 of the circuit substrate 1 has been covered with plastics material 10 to form a thick thermally and electrically insulating layer having a substantially planar upper surface 13. The plastics material may be coated onto the substrate 1 in known manner to form a mechanically stable bond to the upper surface 3. Thus, for example, a method similar to that described in European patent application EP-A-0 055 819 may be used. In order to form a good interface between the circuit substrate 1 and the detector element array, the plastics layer 10 is preferably more than 5 $\mu$m (micrometers) thick and even about 10 $\mu$m thick or more. The use of a plastics coating particularly with such a large thickness facilitates the attainment of a substantially planar upper surface 13 for stable mounting of the detector elements so resulting in a rugged structure, provides good thermal insulation between the detector elements and the circuit substrate 1, and provides physical cushioning between the detector elements and the circuit substrate 1 which permits the detector elements to be formed in situ on the substrate 1 for example by sawing (see FIG. 4) and which may also, during operation of the device, dampen vibrations from the substrate 1. A variety of plastics materials may be used for the layer 10; particularly advantageous properties are achieved using polyimides.

After forming the plastics covering 10, bore holes 11 are formed throughout its thickness over the substrate electrodes 2, by locally removing the plastics material. A further advantage of using plastics material, is that these bores 11 can be formed simply by drilling with a laser beam 18. For this purpose the laser beam 18 may be fired at a fixed location, the plastics-coated substrate being stepped in its position between firings of the laser to drill the array of bores 11 corresponding to the array of substrate electrodes 2. Circular bores 11 thus drilled in the plastics layer 10 may have a diameter as small as, for example, 10 $\mu$m. The resulting structure is illustrated in FIG. 2.

Figure 2:
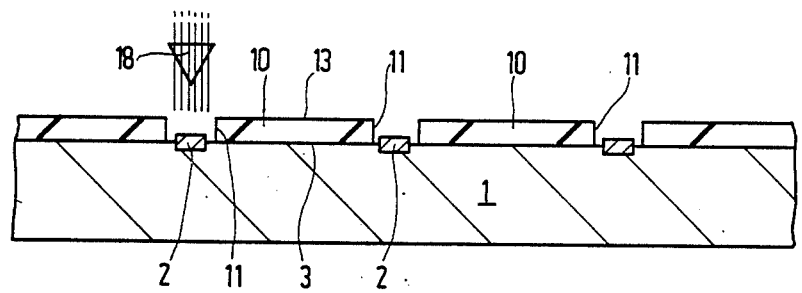

FIG. 2 illustrates, by way of example, a situation in which the diameter of the bores 11 is larger than the width of the substrate electrodes 2 so that the whole of each electrode 2 is exposed by the associated bore 11 in the plastics coating 10. However, it should be understood that the substrate electrodes 2 may be wider than the bores 11 so that only a part of each electrode 2 is exposed; this will normally be the case when bores 11 with a diameter as narrow as 10 $\mu$m are formed. It should also be understood that the bores 11 need not be circular and may be formed in a different way. Thus, for example, a polyimide coating 10 may initially be only partially cured after which a photolithographic and etching step with, for example, a potassium hydroxide or sodium hydroxide solution may be used to etch the bores 11 into the polyimide material before totally curing the coating 10. On yet another form with photolithography, reactive ion etching may be used to form the bores 11.

Figure 3:
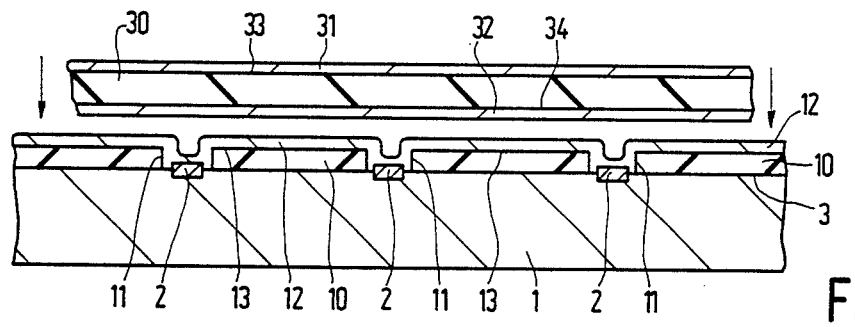

Metal is now deposited to form a metal coating 12 in the bores 11 and also on the upper surface 13 of the plastics material 10 at least around the bores 11. The metal coating 12 is sufficiently thin as not to fill the bores. A variety of metals may be used, for example, gold having a thickness of, for example, 15 nm on, for example, a nichrome seeding surface. FIG. 3 illustrates a metallised structure in which the metal 12 forms a continuous coating on the upper surface 13 of the plastics material 10.

A sheet of ferroelectric or pyroelectric material 30 is then mounted on the metal-coated upper surface 13 of the plastics material 10. The sheet 30 may be of any of a wide variety of materials suitable for forming an infrared detector element, for example as described in EP-A-0 173 368 and GB-A-2 030 023. Particular examples are: lead zirconate titanate (for example lanthanum-doped lead zirconate titanate PLZT), barium titanate, triglycene sulphate (TGS), barium strontium titanate, lead titanate, potassium tantaloniobate, potassium dihydrogen phosphate, and Rochelle salt. The upper and lower surfaces 33 and 34 of the sheet 30 are each coated with a metal layer 31 and 32 respectively. These layers 31 and 32 may be of any suitably electrically conductive material or combination of materials which forms good adhesion to the surfaces of the pyroelectric or ferroelectric material 30. A particular example which may be used with lead zirconate titanate, both for the lower layer 32 and for the upper layer 31, is a layer of gold with a resistance of about 150 ohms per square, on nichrome. These layers 31 and 32 may act as the primary absorbers of the infrared radiation to be detected, thereby indirectly changing the temperature of the ferroelectric/pyroelectric material of the detector element. The ferroelectric or pyroelectric sheet 30 may be, for example, between 10 and 40 $\mu$m thick. FIG. 3 illustrates the metallized sheet 30 about to be mounted on the metal-coated upper surface 13 of the plastics coating 10 on the circuit substrate 1.

The sheet 30 may be secured on the plastics coating 30 by, for example, a thin layer of conductive epoxy between the metal layers 12 and 32. The amount and location of the epoxy between the surfaces is such that it does not extend into the bores 11. In this way the substrate electrodes 2 are electrically connected to the layer 32 from which signal electrodes of the detector elements are formed. In the structure illustrated in FIG. 3 both metal layers 31 and 32 are continuous coatings on their respective surfaces 33 and 34 of the sheet 30.

The detector element array is now formed in situ on the circuit substrate 1. The sheet 30 is divided into individual detector element areas by forming grooves 36 through its thickness. Because of the cushioning effect of the thick plastics coating 10 on the substrate 1, these grooves 36 may be formed by cutting the material with a saw having a blade which is for example between 15 μm and 20 μm. As illustrated in the plan view of FIG. 4, in order to form a square or rectangular array, two orthogonal sets (X and Y directions) of parallel grooves 36 are cut to divide the sheet 30 into individual elements 38 each overlying a metallized bore 11 in the plastics material 10. In a particular example, the grooves 36 may be about 25 μm wide and the individual element areas 38 may be, for example, 100 μm×100 μm. These grooves 36 also divide the metal layers 33 and 34 into separate electrodes of the detector elements.

Figure 5:
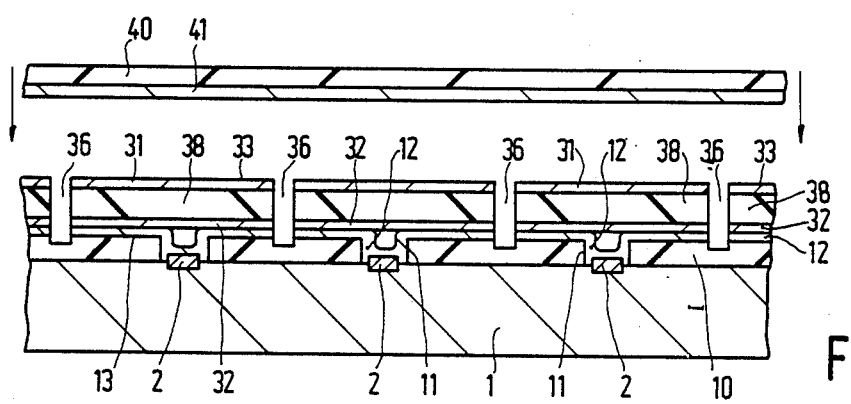

As illustrated in FIG. 5 the saw cut is of a sufficient depth that the grooves 36 formed between the detector elements 38 are extended into the plastics material 10, through the continuous metal coating 12 on the upper surface 13 of the plastics material 10, thereby dividing this continuous metal coating 12 into separate electrode connections at the lower surface 34 of the detector elements 38. Because of the good thermal and electrical insulation properties of the plastics material 10, there is no necessity to continue the grooves through the thickness of the plastics coating 10 to prevent cross-talk by conduction through the plastics material 10. The grooves 36 are merely cut to a sufficient depth to reliably divide the metal coating 12 while stopping a reliably safe distance from the upper surface 3 of the circuit substrate.

The insulation properties of the plastics material 10 are comparable to or even better than those of the pyroelectric or ferroelectric material 30. Thus, for example, the thermal conductivities of PLZT is about $3\times 10^{-2}$ W. cm$^{-1}$. K$^{-1}$ while that of a polyimide is about $5\times 10^{-3}$ W.cm$^{-1}$. K$^{-1}$. Thus, with these better insulation properties for the plastics coating 10 than for the ferroelectric or pyroelectric material, an important advantage of this manufacturing method in accordance with the invention is that the detector element array is fully reticulated by the grooves 36 between the detector elements 38 so providing good lateral as well as vertical insulation.

Instead of cutting with a saw, the grooves 36 may be etched through the layers 31, 30, 32 and 2 using ion beam etching through a photolithographic mask. However, it is found that a saw cut can more easily form narrow grooves 36 with side walls which are more vertical.

After forming this array of separate detector elements 38 each firmly mounted on the plastics coating 10 and each having an individual signal electrode 32 electrically connected to a substrate conductor 2, top electrode connections 41 are provided at the upper surface 31 of the detector elements 38. These connections 41 may be formed by at least one metal conductor carried on the lower surface of a plastics film 40. The film 40 may be of, for example, a polyimide having a thickness of, for example, about 1 μm. The metal conductor(s) 41 may be a layer of, for example, gold having a thickness of, for example, 15 nm.

FIG. 5 illustrates the plastics and conductor laminate 40 and 41 about to be mounted on the upper surface 33 of the detector element array. When it is desired to connect all the top electrodes 31 of the detector elements 38 in common, a single large-area metal layer 41 may be carried by the film 40. However when it is desired to connect in common only the detector elements 38 in each column the film may carry parallel metal stripes extending longitudinally in the X direction in FIG. 4. By mounting the plastics film 40 over the array each of the metal stripes 41 or the single layer 41 bridges the grooves 36 between the detector elements 38 while making electrical connections to the top electrodes 31. The metal conductor(s) 41 are bonded to the top electrodes 31, and the periphery of the plastics film 40 may be bonded to the circuit substrate 1 or to a mount carrying the substrate 1 so as to encapsulate the array structure.

Figure 6:
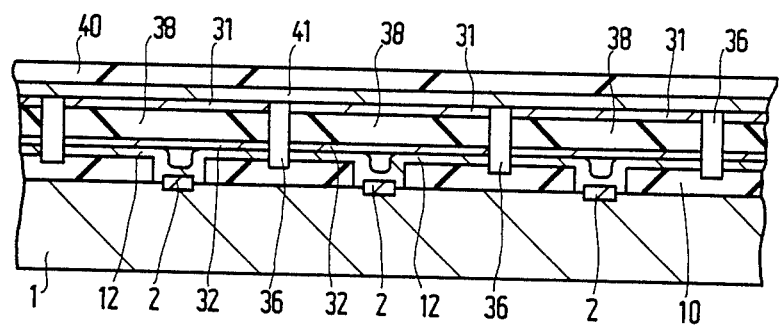

The resulting device (FIG. 6) is suitable for detecting infrared radiation incident via the upper plastics film 40. If so desired, blackening may be applied in known manner to the areas above each detector element 38 to improve absorption of the radiation at the elements 38. Although it is advantageous for the detector elements 38 and their connections to be encapsulated between the plastics film 40 and the plastics coating 10, it is possible to use a film 40 with individual holes cut therethrough which are located over the individual detector elements 38 in order to increase the transmission of the infrared radiation to the detector elements 38 and their electrodes 31.

Figure 7:
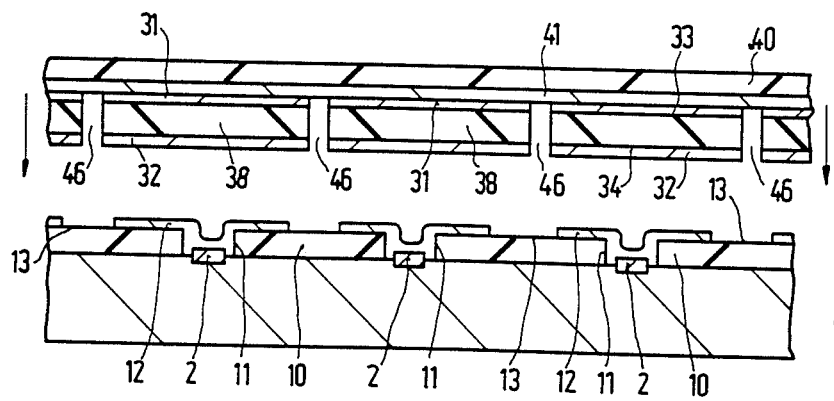
FIG. 7 illustrates a modification in the method, also in accordance with the present invention.

It will be evident that many more modifications are possible within the scope of the present invention. It is particularly convenient to cut the grooves between the detector elements sufficiently deep as to divide the metal coating 12 as well as the electrode layers 32 and 33 all in one operation. However, if desired, the metal coating 12 may be localised on the upper surface 13 using a masking step before mounting the detector element material. Such an arrangement is illustrated in FIG. 7 and may be used in the process of FIGS. 1 to 6. Thus, the metal 12 may be deposited only locally in and around the bores 11 at windows in a masking layer, or after providing a continuous metal coating 12 parts may be removed for example by etching to leave separate areas of the metal coating 12 only in and around the bores 11.

Instead of forming the fully reticulated array in situ on the substrate, the array of detector elements separated from each other by grooves 46 may be carrried on a plastics film 40 having at least one metal conductor 41 which provides top electrode connections to the detector elements 38. Such an arrangement is illustrated in FIG. 7. The plastics film 40 is then mounted over the upper surface 13 of the insulating plastics coating 10, with the detector elements 38 located between the plastics film 40 and the plastics coating 10 and connected to separate areas of the metal coating 12 on the upper surface of the plastics coating 10.

Instead of coating the substrate 1 with plastics material 10, a pre-formed film 10 of plastics material (for example, a polyimide) may be placed over and then bonded to the upper surface 3 of the circuit substrate 1. Before the film 10 is placed on the substrate 1, the bores 11 may be cut in the film 10 which is subsequently carefully positioned on the substrate 1 to expose at least part of each substrate electrode 2 at an associated bore 11.

Instead of using a top plastics film 40 to carry the top electrode connections 41, these connections 41 may be self-supporting over the grooves between the detector elements. It is preferable for the grooves 36 or 46 to be unfilled so as to maintain very good thermal insulation between the elements 38. However the grooves 36 or 46 may be filled with a good insulation material if desired.

Thus, a sub-assembly of pyroelectric or ferroelectric elements 38 may be formed using, for example, a method as described with reference to FIGS. 6a, 6b and 6c of EP-A-0 173 368 so that the elements 38 are separated by grooves filled with, for example, insulating epoxy resin. This sub-assembly may be used in the modified method of FIG. 7 of the present specification, instead of the array 38 carried by the laminate film 40, 41; in this case the top electrode connections of the elements 38 may be formed simply by deposited metal on the upper surface of this element sub-assembly. Furthermore, in the modified method of FIG. 7, instead of the reticulated array 38 carried by the laminate film 40, 41, a single wafer of pyroelectric or ferroelectric material such as described in GB-A-2 030 023 (FIGS. 7a to 7c, and 8a to 8c) and in EP-A-0 173 368 (FIG. 5) may be used, having individual signal electrodes 32 at its lower surface and one or more common electrodes 33 at its top surface.

As can be seen from the foregoing the present invention provides a particular convenient method for the manufacture of thermal-image sensing device and also provides device structures having particularly advantageous properties. Thus, the invention provides a thermal-image sensing device comprising a 2-dimensional array of ferroelectric or pyroelectric infrared detector elements 38 which are mounted on a circuit substrate 1 via an intermediate layer 10 of thermally and electrically insulating plastics material. Each of the detector elements 38 is electrically connected to a respective electrode 2 of the circuit substrate 1 by means of a metal coating over the wall of a respective bore 11 in the insulating plastics layer 10 and associated with that detector element 38. Preferably, the detector elements 38 are separated from each other by grooves 36 or 46 which may extend into the insulating plastics layer 10 and which are bridged by top electrode connections 41 of the detector elements 38. The grooves 36 or 46 are preferably unfilled.

From reading the present disclosure, other modifications will be apparent to persons skilled in the art. Such modifications may involve other features which are already known in the manufacture, design and use of thermal-image sensing devices and systems and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicity or any generalisation or modification of one or more of those features which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A method of manufacturing a thermal-image sensing device comprising a 2-dimensional array of ferroelectric or pyroelectric infrared detector elements which are mounted on an integrated circuit substrate via an intermediate layer of thermally and electrically insulating material, the substrate comprising electronic circuitry for processing signals from the detector elements in which method a corresponding 2-dimensional array of bores is formed in the insulating layer, and each of the detector elements is electrically connected to a respective electrode of the circuit substrate by means of a metal coating over the wall of its respective bore, characterised by the steps of:
   (a) covering at least part of an upper surface of the circuit substrate comprising the electronic circuitry with plastics material to a thickness sufficient to form said insulating layer as a cushioning support for the detector elements and with a substantially planar upper surface,
   (b) locally removing the plastics material from over said electrodes of the circuit substrate so as to form said bores in the insulating layer,
   (c) depositing metal to form the metal coating in the bores and also on the upper surface of the plastics material at least around the bores, the metal coating being sufficiently thin as not to fill the bores, and
   (d) mounting the array of detector elements on the metal-coated upper surface of the plastics material to form a rugged cushioning support for the detector elements on the circuit substrate.

2. A method as claimed in claim 1, further characterised in that the provision of the array of detector elements comprises the steps of:
   (e) mounting a sheet of the ferroelectric or pyroelectric material on the metal-coated upper surface of the plastics material,
   (f) forming grooves through the thickness of the sheet of ferroelectric or pyroelectric material to divide the sheet into the array of detector elements, and
   (g) providing top electrode connections at the upper surface of the detector elements, which top electrode connections bridge the grooves between the detector elements.

3. A method as claimed in claim 2, further characterised in that the metal deposited in and around the bores in step (c) forms a continuous coating on the upper surface of the plastics material, and that the grooves formed between the detector elements in step (f) are extended into the plastics material, through the continuous metal coating on the upper surface of the plastics material, thereby dividing the continuous metal coating into separate electrode connections at the lower surface of the detector elements.

4. A method as claimed in claim 3, further characterised in that the grooves are formed in step (f) by cutting the material with a saw.

5. A method as claimed in claim 2, further characterised in that the top electrode connections are formed by at least one metal conductor carried on the lower surface of a plastics film which is mounted over the array of detector elements in step (g).

6. A method as claimed in claim 2, further characterised in that, before the mounting step (e), the upper and lower surfaces of the sheet of the ferroelectric or pyroelectric material are each coated with a metal layer, and that the grooves formed between the detector elements in step (f) also divides these metal layers into separate electrodes of the detector elements.

7. A method as claimed in claim 1, further characterised in that the array of detector elements are carried on a plastics film having at least one metal conductor which provides top electrode connections to the detector elements, and that the plastics film is mounted over the upper surface of the insulating layer of plastics material, with the detector elements located between the plastics film and the insulating layer and connected to separate areas of said metal coating on the upper surface of the insulating layer.

8. A method as claimed in claim 1, further characterised in that the layer of plastics material is at least 10 μm (micrometres) thick.

9. A thermal-image sensing device comprising a 2-dimensional array of ferroelectric or pyroelectric infrared detector elements which are separated from each other by grooves, an integrated circuit substrate comprising electronic circuitry for processing signals from the detector elements, an intermediate layer of thermally and electrically insulating plastics material via which the detector elements are mounted on the circuit substrate, the plastics material forming a coating on at least part of the upper surface of the circuit substrate and having a thickness sufficient to form a rugged but cushioning support for the detector elements at a substantially planar upper surface of the coating, a corresponding 2-dimensional array of bores extending through the thickness of the coating to electrodes of the circuit substrate, each of the detector elements being connected to a respective electrode of the circuit substrate by means of a metal coating over the wall of its respective bore, which metal coating in the bores extends over the respective electrodes of the circuit substrate, and a plastics film carrying at least one metal conductor being mounted on top of the array of detector elements to provide top electrode connections which bridge the grooves between the detector elements.

10. A method of manufacturing a thermal-image sensing device comprising a 2-dimensional array of pyroelectric infrared detector elements which are mounted on an integrated circuit substrate via a thermally and electrically insulating layer, the substrate comprising electronic circuitry for processing signals from the detector elements, which method includes the steps of:

(a) covering at least part of an upper surface of the circuit substrate comprising the electronic circuitry with plastic material to a thickness sufficient to form said insulating layer as a cushioning layer for the detector element fabrication in subsequent step (e) and with a substantially planar upper surface;

(b) locally removing the plastics material from over a 2-dimensional array of electrodes of the circuit substrate so as to form a two-dimensional array of bores in the insulating layer;

(c) depositing metal to form a metal coating over the walls of the bores and also on the upper surface of the plastics material at least around the bores, the metal coating being sufficiently thin as not to fill the bores, (d) mounting a body of the pyroelectric material on the metal-coated upper surface of the plastics material, the upper and lower surfaces of the body having electrode metallization thereon, the electrode metallization at the lower surface being connected via the metal coating in the bores to the electrodes of the circuit substrate;

(e) cutting through the thickness of the body and its electrode metallization and into the plastics material to divide the body into the array of detector elements, the thickness of the plastics material being sufficient to form a rugged cushioning layer between the detector elements and the circuit substrate during this cutting step; and (f) providing top electrode connections to the electrode metallization at the upper surface of the detector elements, which top electrode connections bridge the cuts between the detector elements.

11. A method as claimed in claim 10, further characterised in that the bores are formed in the plastics material in step (b) by drilling with a laser beam.

12. A method as claimed in claim 10, further characterised in that the plastics material is a polyimide.

13. A method as claimed in claim 12, wherein a photolithographic and etching process is used to form the bores in the polyimide material.

* * * * *